US008820960B2

(12) United States Patent
Yamamoto (10) Patent No.: US 8,820,960 B2
(45) Date of Patent: Sep. 2, 2014

(54) LIGHT EMITTING DEVICE

(75) Inventor: Yuya Yamamoto, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/396,855

(22) Filed: Feb. 15, 2012

(65) Prior Publication Data

US 2012/0211779 A1     Aug. 23, 2012

(30) Foreign Application Priority Data

Feb. 18, 2011   (JP) ................................. 2011-033581

(51) Int. Cl.
| | |
|---|---|
| H01L 27/15 | (2006.01) |
| H05B 33/08 | (2006.01) |
| F21V 23/00 | (2006.01) |
| F21K 99/00 | (2010.01) |
| H01L 25/075 | (2006.01) |
| F21Y 101/02 | (2006.01) |
| F21Y 113/00 | (2006.01) |
| F21Y 105/00 | (2006.01) |
| H01L 33/50 | (2010.01) |

(52) U.S. Cl.
CPC .......... *F21V 23/005* (2013.01); *H05B 33/0857* (2013.01); *F21Y 2101/02* (2013.01); *F21Y 2113/005* (2013.01); *F21K 9/00* (2013.01); *F21Y 2105/001* (2013.01); *H01L 25/0753* (2013.01); *H01L 33/504* (2013.01)
USPC ............... 362/231; 362/235; 257/88; 257/89; 257/E27.12

(58) Field of Classification Search
CPC .... H01L 25/0753; H01L 33/504; H01L 33/56
USPC ................. 257/89, 88, E27.12; 362/231, 235
See application file for complete search history.

(56) References Cited

U.S. PATENT DOCUMENTS

| | | | |
|---|---|---|---|
| 2005/0206305 A1 | 9/2005 | Masuda et al. | |
| 2010/0225673 A1* | 9/2010 | Miller et al. | ................. 345/690 |
| 2010/0264842 A1* | 10/2010 | Shimizu et al. | ............... 315/287 |
| 2011/0037080 A1 | 2/2011 | Emerson et al. | |

FOREIGN PATENT DOCUMENTS

| | | |
|---|---|---|
| CN | 100517794 C | 7/2009 |
| JP | 4286935 | 4/2009 |
| WO | 2010/106504 A1 | 9/2010 |

OTHER PUBLICATIONS

The European Search Report in corresponding European Application No. EP 12000982.4, dated Jul. 22, 2013.
The Chinese Office Action dated Feb. 8, 2014 (w/English translation).

* cited by examiner

*Primary Examiner* — Matthew W Such
*Assistant Examiner* — David Spalla
(74) *Attorney, Agent, or Firm* — Bacon & Thomas, PLLC

(57) ABSTRACT

A light emitting device includes a white light emitting unit including a first light source emitting a white light; a red light emitting unit including a second light source emitting a white light and a red coating member having a red fluorescent material which converts the white light from the second light source into a red light; and a green light emitting unit including a third light source emitting a white light and a green coating member having a green fluorescent material which converts the white light from the third light source into a green light. The light emitting device further includes a driver for individually driving the white, the red and the green light emitting unit.

17 Claims, 6 Drawing Sheets

LIGHT EMITTING DEVICE

FIELD OF THE INVENTION

The present invention relates to a light emitting device including a plurality of solid light emitting sources.

BACKGROUND OF THE INVENTION

A light emitting diode (LED) emits a light having high brightness with low power consumption and thus has been used as a light source of various electric devices such as a display, a lighting device and the like. Recently, as a blue LED has been commercialized in addition to a red LED and a green LED, those LEDs of three RGB colors have been combined to create lights of various colors. Also, there is proposed a light emitting device employing such LED light sources emitting lights of different colors, and complementarily controlling light amounts thereof to thereby adjust chromaticity of a light of mixed color.

In these types of light emitting devices, when a chromaticity variation range of each LED light source is large, a chromaticity difference of the light of mixed color is also increased, which may cause the color difference in different light emitting devices. Thus, a lighting device has been disclosed, in which a light source for emitting a light of a non-white color is coated with a resin cap to firstly convert the color of the emitted light into the white color and then radiate a light of a desired color by virtue of a coated color filter (see, e.g., Japanese Patent Application Publication No. 4286935 (JP4286935B)). Using this lighting device can facilitate the acquisition of light sources because it is not necessary to limit light sources to those emitting lights of a same color.

However, in the lighting device described in JP4286935B, lights of various colors other than the white color are first converted into a white light, and thus parts of the lights are lost during the conversion, which may lower light emission efficiency. In particular, when emitting a light with a light emission spectrum significantly different from that of the white light, it is necessary to increase a concentration of a fluorescent material contained in the resin cap for conversion into the white color, which may greatly degrade light emission efficiency. In addition, in case of emitting a light of the white color by combination of three-color RGB LEDs, and then further converting the produced white color light into a light of different color, the color conversion is carried out twice, resulting in the increased loss of optical energy.

SUMMARY OF THE INVENTION

In view of the above, the present invention provides a light emitting device capable of reducing a chromaticity variation in the light of mixed color and improving a light emission efficiency.

In accordance with an embodiment of the present invention, there is provided a light emitting device including a white light emitting unit including a first light source emitting a white light; a red light emitting unit including a second light source emitting a white light and a red coating member having a red fluorescent material which converts the white light from the second light source into a red light; a green light emitting unit including a third light source emitting a white light and a green coating member having a green fluorescent material which converts the white light from the third light source into a green light; and a driver for individually driving the white, the red and the green light emitting unit.

The white light emitting unit includes an adjustment coating member for adjusting a chromaticity range of the white light from the first light source.

In accordance with the embodiment of the present invention, the light emitting device includes the red and the green light emitting unit respectively formed by coating the red and the green coating member on the LED unit emitting a white light. Accordingly, it is possible to reduce the chromaticity variations of lights emitted from the red and the green light emitting units. Thus, it is possible to reduce a chromaticity variation of the light obtained by mixing lights emitted from the red, the green and the white light emitting unit. In addition, since the white light emitting unit uses the LED unit emitting a white light as it is, it is possible to reduce an optical loss caused by the coating member or the like and improve emission efficiency of the light emitting device.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Hereinafter, a light emitting device 1 in accordance with an embodiment of the present invention will be described with referent to FIGS. 1 to 6 which form a part hereof. The light emitting device 1 includes a plurality of light emitting units 2 which emit lights of different color. A light emitting diode (LED) unit 20 which emits a white light is used as a light source of each of the light emitting units 2. The light emitting units 2, as shown in FIG. 1, include white light emitting units 2W for emitting white lights, red light emitting units 2R for emitting red lights, and green light emitting units 2G for emitting green lights, each having one LED unit 20.

Each of the red light emitting units 2R further includes a red coating member 3R having a red fluorescent material converting the light emitted from the LED unit 20 into a red light. Each of the green light emitting units 2G further includes a green coating member 3G having a green fluorescent material converting the light emitted from the LED unit 20 into a green light. Each of the white light emitting units 2W may further include, when necessary, an adjustment coating member 6 for appropriately adjusting a chromaticity range of the white light emitted from the LED unit 20. In addition, the light emitting device 1 includes a driver 4 for individually lighting the white light emitting units 2W, the red light emitting units 2R, and the green emitting units 2G. The light emitting units emitting one color are driven independently from those emitting different colors.

Figure 1:
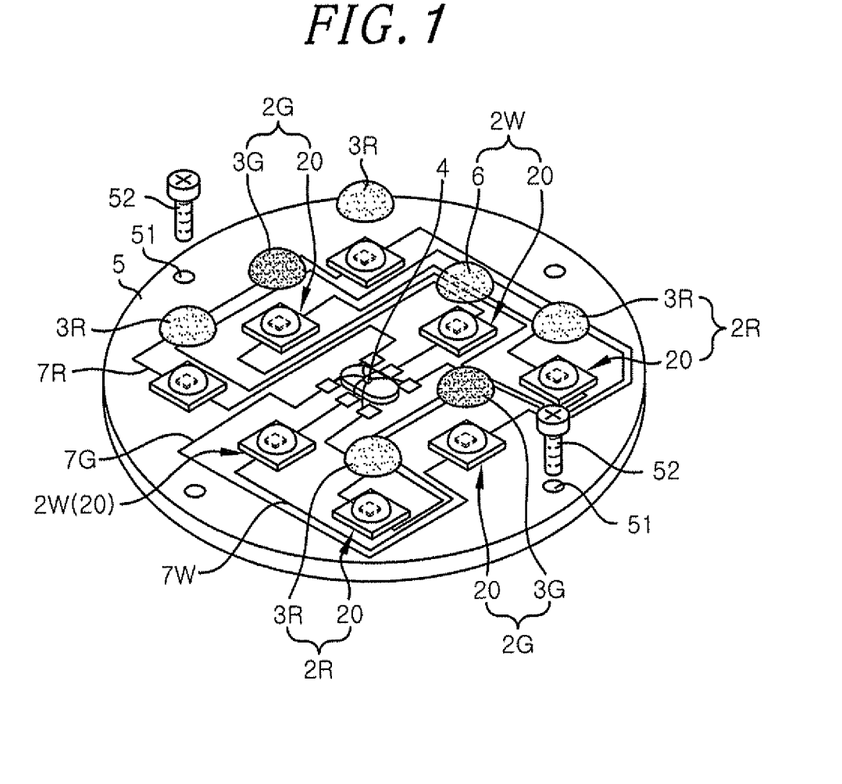
FIG. 1 is a perspective view of a light emitting device in accordance with an embodiment of the present invention.

In the example shown in FIG. 1, the light emitting device 1 has a configuration including two white light emitting units 2W, four red light emitting units 2R, and two green light emitting units 2G. Further, only one of the two white light emitting units 2W includes the adjustment coating member 6. The driver 4 is disposed at a central portion of a circuit board 5, so that the LED units 20 of the white, the red and the green light emitting units 2W, 2R and 2G are mounted at certain positions on the circuit board 5 to surround the driver 4.

The driver 4 has sets of output terminals corresponding to the light emitting units 2W, 2R, and 2G, which emit different colors of light, respectively. Further, the circuit board 5 includes wiring circuits 7W, 7R, and 7G respectively electrically connecting the light emitting units 2W, 2R, and 2G in such a manner that the light emitting units emitting a same color are connected to a same set of output terminals of the driver 4. The light emitting device 1 having such a configuration is preferably embedded in a lighting apparatus (not shown) capable of controlling a color temperature of an emission light of the light emitting device 1.

The circuit board 5 is a board for a general purpose light emitting module, and may include metal oxide or metal nitride (including a ceramic), such as aluminum oxide ($Al_2O_3$) or aluminum nitride (AlN), having an electric insulating property; metal; resin; glass fiber; and/or the like. A plurality of through holes 51 are formed at an edge portion of the circuit board 5 such that corresponding fixing screws 52 can be respectively inserted through the through holes 51, thereby securing the light emitting device onto a main body (not shown) of a lighting apparatus.

Figure 2A:
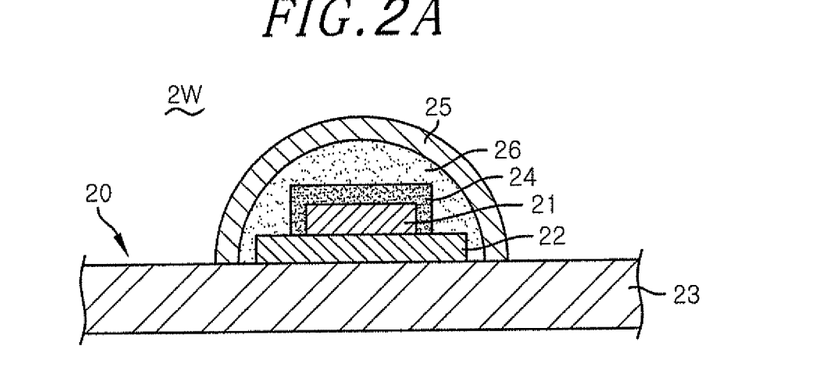
FIG. 2A is a side sectional view of a white light emitting unit included in the light emitting device.

As shown in FIG. 2A, the LED unit 20 includes an LED chip 21, a submount member 22 supporting the LED chip 21, and a mounting board 23 on which the LED chip 21 is mounted via the submount member 22. The LED chip 21 is coated with a coating resin 24 containing a fluorescent material. Further, Each LED unit 20 further includes a dome-shaped transparent cover 25 which covers the LED chip 21 and the submount member 22. Further, a sealant 26 is filled between the transparent cover 25 and the mounting board 23.

The LED chip 21 is preferably implemented by using a GaN-based blue LED chip emitting a blue light, and an anode electrode and a cathode electrode, which are not shown, may be formed on one surface of the blue LED chip having a rectangular shape. Further, the LED chip 21 is not limited to this structure. For example, the anode electrode and the cathode electrode may be formed on different surfaces.

As for the coating resin 24, a transparent resin, e.g., a silicone resin or the like containing a YAG-based yellow fluorescent material may be employed. The LED chip 21 coated with the coating resin 24 can emit a white light by mixing the blue light emitted from the LED chip 21 and a yellow light produced by a wavelength conversion of the blue light by the yellow fluorescent material. Instead of the coating resin 24 containing the YAG-based yellow fluorescent material, the coating resin 24 containing no YAG-based yellow fluorescent material may be employed, and the yellow fluorescent material may be contained in the sealant 26. The transparent cover 25 and the sealant 26 may be formed of a transparent resin such as a silicone resin or the like. Further, it is preferable that the transparent cover 25 and the sealant 26 are formed of a same material or different materials having a same refractive index.

The submount member 22 may be a rectangular plate member having a size larger than the LED chip 21. The submount member 22 is formed of an electrically insulating material having a high thermal conductivity. Further, the submount member 22 has thereon an electrode pattern (not shown) which electrically connected to the anode electrode and the cathode electrode of each LED chip 21 by using bonding wires (not shown) or the like. A mounting surface of the submount member 22 may be configured to have a specular reflection or a diffused reflection property. The LED chip 21 is mounted to the submount member 22, for example, by using solder, silver paste or the like.

The mounting board 23 is a rectangular plate member having a size larger than that of the submount member 22 and implemented by a printed wiring board having a conductive pattern (not shown) connected to the electrode pattern of the submount member 22. The conductive pattern is covered by a protective layer (not shown) having an insulating property, except a portion connected with the electrode pattern of the submount member 22 and an electrode portion (not shown) for external connection.

Further, the mounting board 23 is in contact with an edge of the submount member 22 and has a heat transfer layer (not shown) extending from the contact between the mounting board 23 and the submount member 22 to the outer periphery thereof, thus allowing heat from the LED chip 21 to be dissipated through the submount member 22 and the heat transfer layer. The LED chip 21 and the submount member 22 are mounted on the mounting board 23, and then the transparent cover 25 is fixed on the mounting board 23 by an adhesive (not shown), such as silicone resin, epoxy resin or the like, to cover the LED chip 21 and the submount member 22.

The LED unit 20 is a ready-made module, which can be provided from the market. The LED color specification (ANSI standard) defined in the U.S. is practically regarded as an international standard. In the LED unit complying with the specification, a chromaticity variation is required to be within a predetermined range from a black body locus. Therefore, in order to improve fabrication efficiency of the light emitting device 1, it is preferable to obtain from the market the LED unit complying with the specification, rather than independently fabricate and/or tailor the LED chip 21, the coating resin 24, and the like.

In the LED unit 20, a light emitted from the LED chip is transmitted through the coating resin 24 and the sealant 26 and radiated as a white light from the transparent cover 25. When the chromaticity of the white light is kept within a predetermined chromaticity range, as to be described later, the LED unit 20 is used as the white light emitting unit 2W as it is. On the contrary, when the chromaticity of the white light from the LED unit 20 is not within the predetermined chromaticity range, the white light emitting unit 2W is implemented by further employing the adjustment coating member 6 (see FIG. 1) for adjusting the chromaticity range, as mentioned above.

The adjustment coating member 6 is formed of a material, in which a red fluorescent material (e.g., CASN fluorescent material ($CaAlSiN_3$:Eu or the like)) or a green fluorescent material (e.g., CSO fluorescent material ($CaSc_2O_4$:Ce or the like) is contained in a transparent resin such as a silicone resin or the like in a required concentration. The adjustment coating member 6 formed of the resin containing the above-described fluorescent material is provided in a dome shape with a small gap from the transparent cover 25.

Figure 2B:
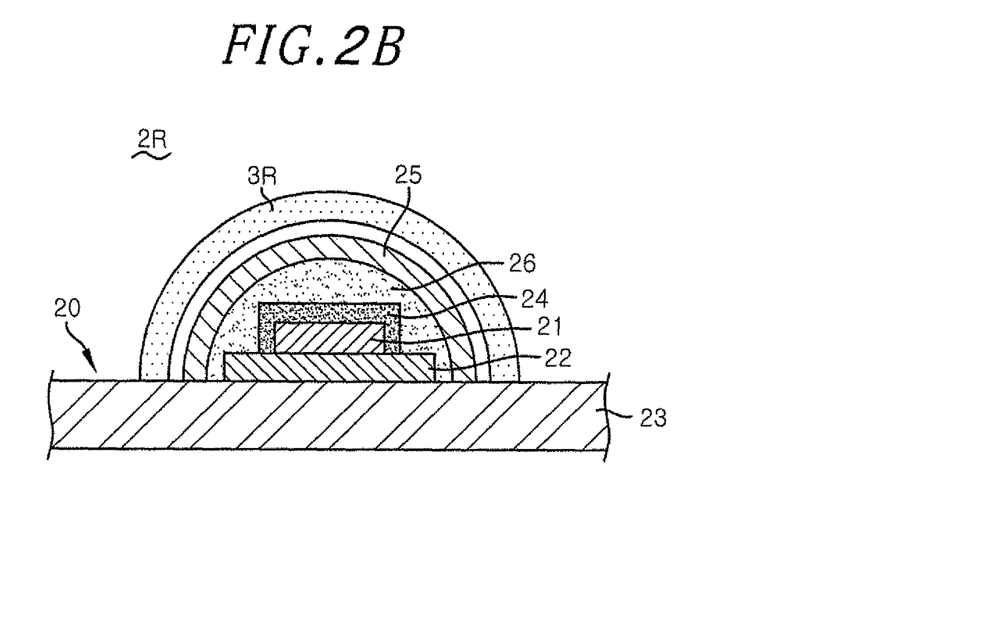
FIG. 2B is a side sectional view of a red light emitting unit included in the light emitting device.
Figure 2C:
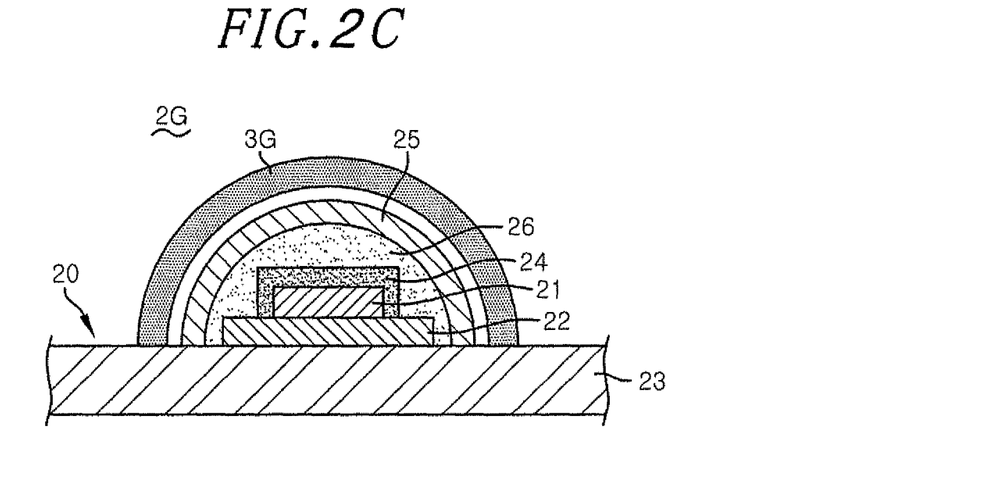
FIG. 2C is a side sectional view of a green light emitting unit included in the light emitting device.

The red light emitting unit 2R, as shown in FIG. 25, is formed by providing a red coating member 3R on the LED unit 20 described above. The red coating member 3R is formed by using a material, in which a red fluorescent material (e.g., CASN: 30 wt %) is contained in the same transparent resin as that of the adjustment coating member 6, and has the same shape as that of the adjustment coating member 6. Similar to the red light emitting unit 2R, the green light emitting unit 2G is formed, as shown in FIG. 2C, by providing on the LED unit 20 a green coating member 3G, in which a green fluorescent material (e.g., CSO: 30 wt %) is contained in the transparent resin.

Figure 3:
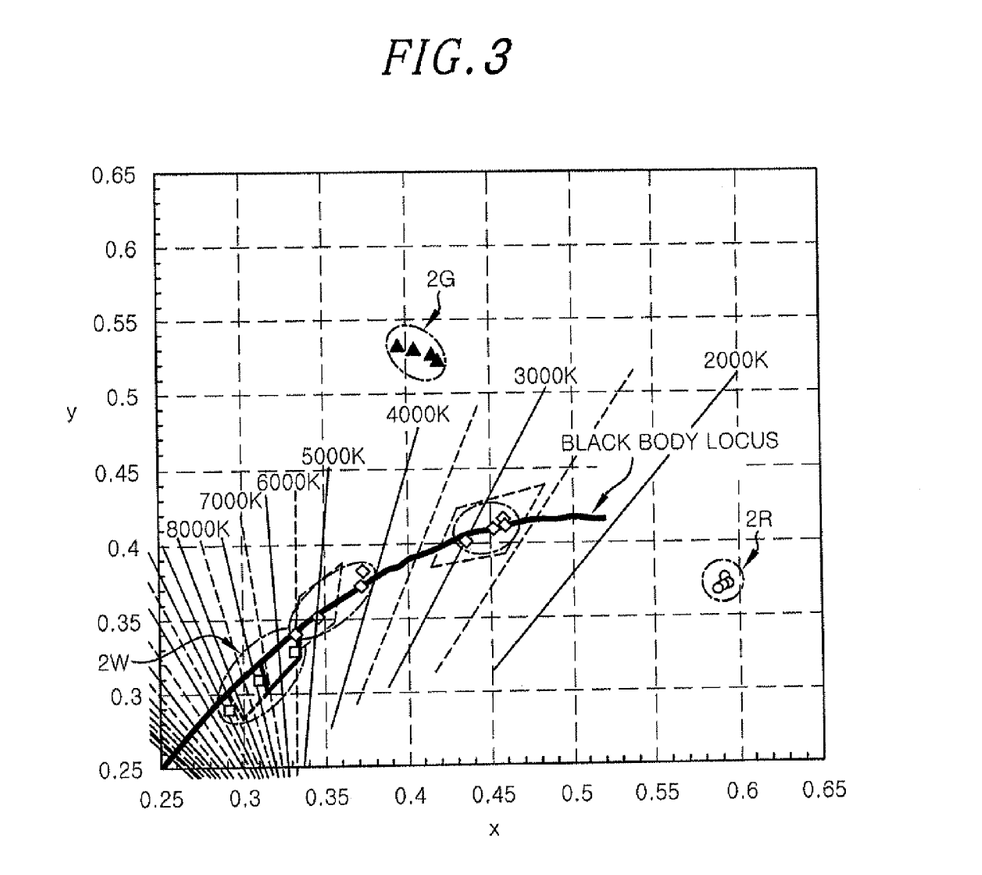
FIG. 3 is a graph showing chromaticity distribution of lights emitted from the respective light emitting units included in the light emitting device and a chromaticity distribution of a mixed color thereof.

FIG. 3 shows chromaticity distribution of lights respectively emitted from the white, the red and the green light emitting unit 2W, 2R and 2G which are formed as described above. When an LED unit complying with the ANSI standard is used as the LED unit 20, the chromaticity of the white light from each unit is scattered within a predetermined range from a black body locus. The chromaticity of the white light from the LED unit 20 (white light emitting unit 2W) is indicated by using a white rectangular mark (□) in FIG. 3. Here, a chromaticity variation of the white light is within a range indicated as 2W in the same drawing.

Moreover, the chromaticity of light emitted from the red light emitting unit 2R that is formed by providing the red coating member 3R on the LED unit 20 is indicated with a white circular mark (○) in the drawing. Similarly, the chromaticity of light emitted from the green light emitting unit 2G that is formed by providing the green coating member 3G on the LED unit 20 is indicated with a black triangular mark (▲) in the drawing. Chromaticities of the red light and the green light are scattered within the ranges indicated by using 2R and 2G, respectively. Further, chromaticity of a mixed light of the white, the red and the green light emitting unit 2W, 2R and 2G is indicated with a white diamond mark (◊).

The red light emitting unit 2R and the green light emitting unit 2G are respectively formed by adjusting a content, a mixing ratio or the like of the fluorescent materials contained in the red and the green coating member 3R and 3G depending on the chromaticity of the white light from the LED unit 20 serving as the light source. Thus, as for the red light and the green light emitting unit 2R and 2G, it is possible to reduce the range, in which the chromaticity of the emitted light is scattered, in comparison with a chromaticity variation of the white light from the LED unit 20 (white light emitting unit 2W).

As such, since the light emitting device 1 includes the red light emitting unit and the green light emitting unit respectively formed by coating the red coating member 3R and the green coating member 3G on the LED unit 20 emitting a white light, it is possible to reduce the chromaticity variations of lights emitted from the red and the green light emitting units. Thus, it is possible to reduce a chromaticity variation of the light obtained by mixing lights emitted from the red, the green and the white light emitting unit 2R, 2G and 2W.

However, as mentioned above, the chromaticity of the white light from the LED unit 20 is scattered within the predetermined range. Even with a small amount of chromaticity variations provided by the red and the green light emitting unit 2R and 2G, when the chromaticity of the white light emitting unit 2W is scattered in a wide range, the chromaticity of a corresponding mixed light may not actually match a desired chromaticity range, and thus a light emitted from a fabricated light emitting device may exhibit the chromaticity falling outside the required chromaticity range.

Figure 4:
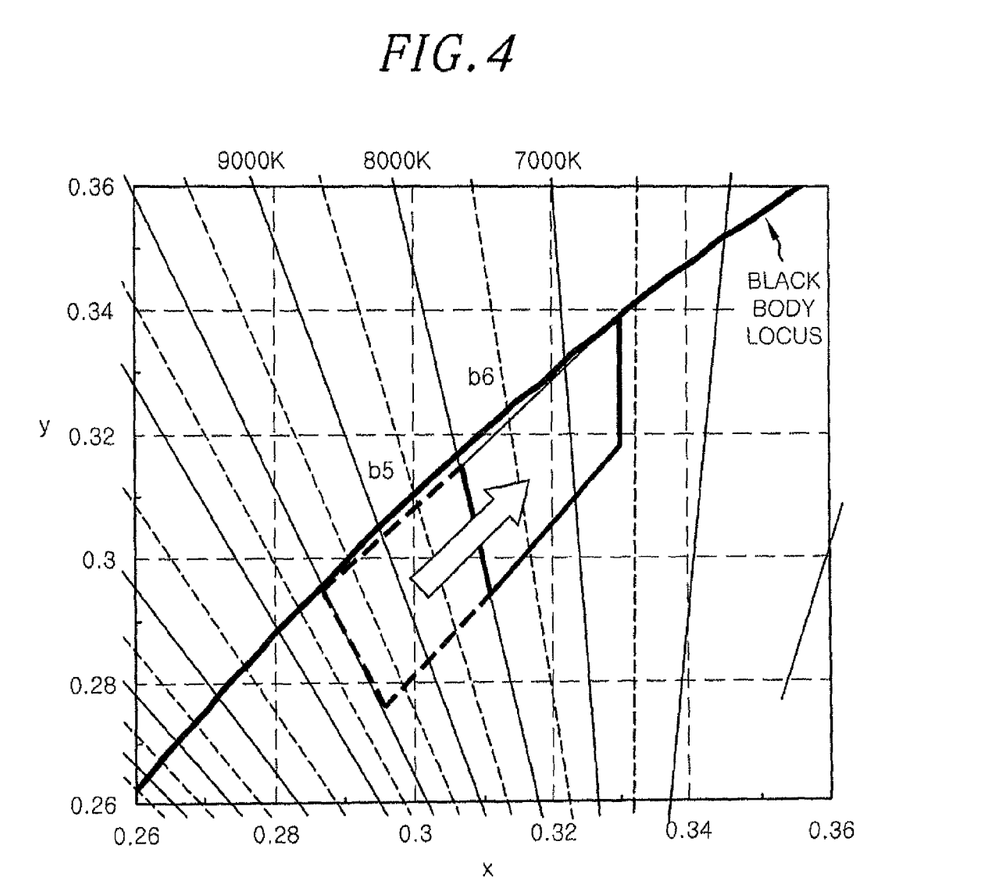
FIG. 4 is a graph showing a chromaticity distribution of a light of white color from the white light emitting unit included in the light emitting device.

Thus, as shown in FIG. 4, within a predetermined chromaticity range b6, the LED unit 20 may be used as the white light emitting unit 2W as it is. However, when the chromaticity of the white light emitted from an LED unit 20 is within a chromaticity range b5, the adjustment coating member 6 is coated on the LED unit 20, thereby shifting the chromaticity of light emitted through the adjustment coating member 6 into the chromaticity range b6. Consequently, it is possible to keep the chromaticity of the white light emitted from the white light emitting unit 2W to be within the chromaticity range b6.

Figure 5:
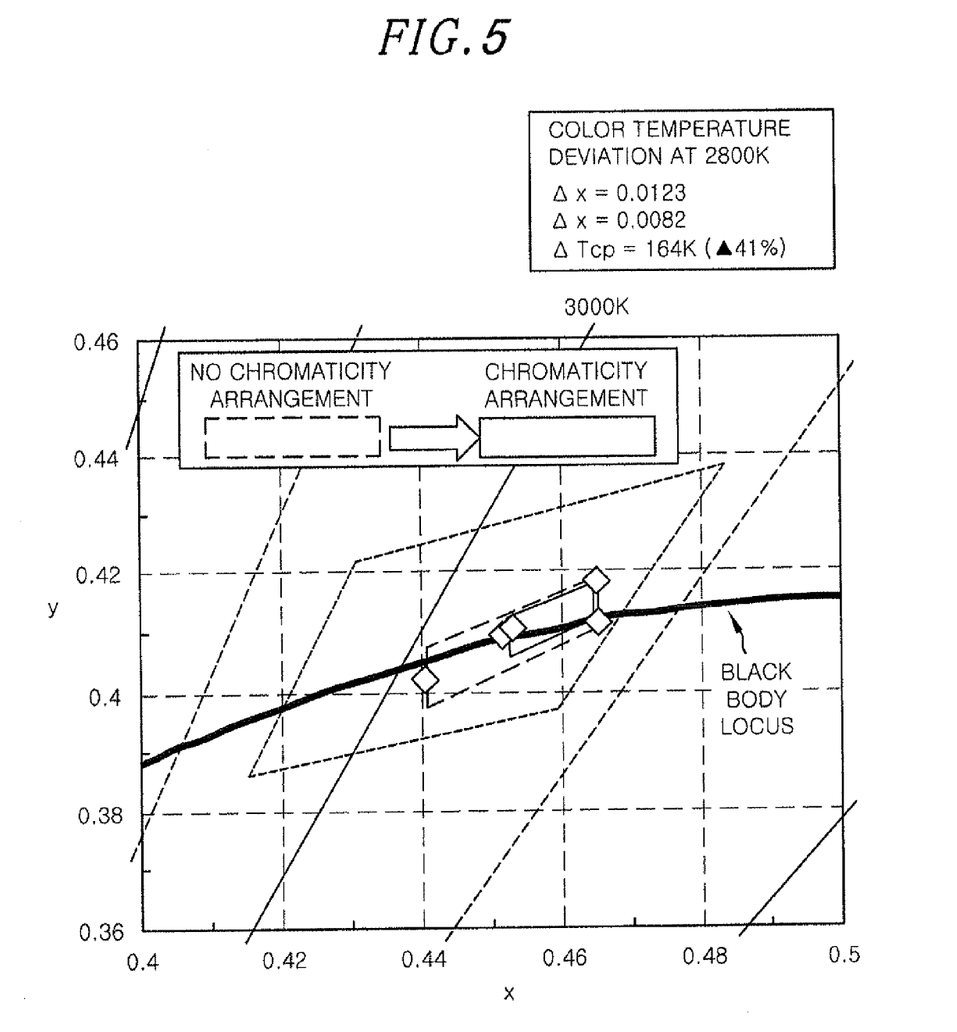
FIG. 5 is a graph showing chromaticity distribution of a light of mixed color wherein a color temperature is adjusted to 2800 K in the light emitting device.

FIG. 5 shows chromaticity distribution of lights emitted by driving the white, the red, and the green light emitting units 2W, 2R and 2G in a plurality of light emitting devices 1 provided in the foregoing manner wherein the color temperatures of the emitted lights (mixed light) were adjusted to 2800 K. When the adjustment coating member 6 was not used for a white light emitting unit 2W, the chromaticities of the emitted lights were scattered within a range indicated by a dash line in FIG. 5.

On the contrary, when the adjustment coating member 6 was appropriately used, the chromaticities of the emitted lights were kept in the range indicated with a solid line box in the drawing. At this time, a deviation ($\Delta x$, $\Delta y$) of the chromaticity variation of the emitted lights was within the range that was not greater than (0.0123, 0.0082) and the variation $\Delta K$ was not greater than 164 K in the color temperature. Further, when the adjustment coating member 6 was appropriately used, the chromaticity difference was reduced to 41% of the case where the adjustment coating member 6 is not used.

Figure 6:
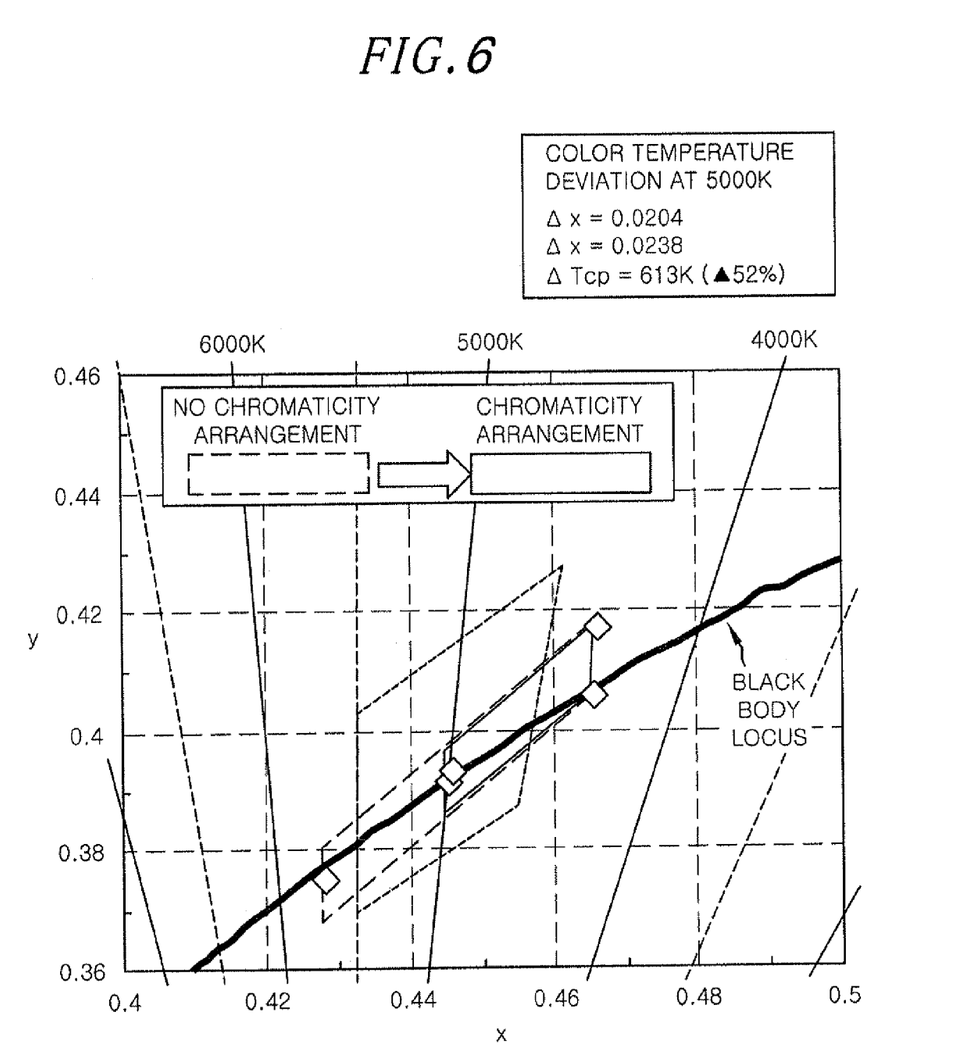
FIG. 6 is a graph showing chromaticity distribution of a mixed color light wherein a color temperature is adjusted to 5000 K in the light emitting device.

FIG. 6 shows color distribution of the lights emitted from the light emitting devices 1 employed in the test shown in FIG. 5 wherein, in this figure, the color temperatures of the emitted lights were adjusted to 5000 K. When the adjustment coating member 6 was appropriately used for the white light emitting unit 2W, a deviation ($\Delta x$, $\Delta y$) of the chromaticity variation of the emitted lights was within the range that was not greater than (0.0204, 0.0238) and the deviation $\Delta K$ was not greater than 623 K in the color temperature. When the adjustment coating member 6 was appropriately used, the chromaticity difference was reduced to 52% of the case where the adjustment coating member 6 is not used.

In accordance with the light emitting device 1 of the present embodiment, the chromaticity variation of the white light from the white light emitting unit 2W can be reduced by appropriately determining whether to use the adjustment coating member 6 depending on the chromaticity of light emitted from the LED unit 20 used for the white light emitting unit 2W. In addition, by combining and individually driving the white, the red and the green light emitting unit 2w, 2R and 2G in each light emitting device, it is possible to emit a light of a mixed color having a desired color temperature and reduce the chromaticity variation in the lights of mixed color emitted from the light emitting devices.

Further, the LED unit 20 which exhibits the chromaticity of the emitted light thereof within the desired range is used as the white light emitting unit 2W as it is without using the adjustment coating member 6. In this case, since, the white light emitting unit 2W uses the LED unit 20 emitting a white light without using the adjustment coating member 6, it is possible to reduce an optical loss caused by the coating member or the like and improve emission efficiency of the light emitting device 1. Moreover, by virtue of use of the adjustment coating member 6, even an LED unit 20, which emits a white light whose chromaticity is not within the desired chromaticity range, can be used in the manufacture of the light emitting device 1 without being wasted, thereby improving a usability of the LED unit 20.

The present invention is not limited to the foregoing embodiment, but various modifications may be made. For example, an LED unit 20 emitting a white light whose chromaticity is not within the predetermined chromaticity range may preferentially be used in the red or the green light emitting unit 2R or 2G, in which the chromaticity can be easily adjusted by the fluorescent materials. In this manner, the LED unit 20 emitting the light having chromaticity kept in the predetermined chromaticity range (see, e.g., b6 in FIG. 4) can preferentially be used for the white light emitting unit 2W. In this case, the adjustment coating member 6 is not needed, thus further improving light emission efficiency of the light emitting device 1.

While the invention has been shown and described with respect to the embodiments, it will be understood by those skilled in the art that various changes and modifications may be made without departing from the scope of the invention as defined in the following claims.

What is claimed is:

1. A light emitting device comprising:
   a white light emitting unit including a first light source emitting a white light;
   a red light emitting unit including a second light source emitting a white light and a red coating member having a red fluorescent material which converts the white light from the second light source into a red light;
   a green light emitting unit including a third light source emitting a white light and a green coating member having a green fluorescent material which converts the white light from the third light source into a green light; and
   a driver configured to individually drive the white, the red and the green light emitting unit
   wherein each, of the first, the second and the third light source includes an LED chip emitting a first light and a fluorescent substance which converts the first light into a second light, and
   wherein each of the first, the second and the third light source emits the white light by mixing a part of the first light not-converted by the fluorescent substance and the second light produced by the fluorescent substance.

2. The light emitting device of claim 1, wherein the white light emitting unit includes an adjustment coating member configured to adjust a chromaticity range of the white light from the first light source.

3. The light emitting device of claim 1, wherein the first light is a blue light and the second fight is a yellow light.

4. The light emitting device of claim 1, wherein the light emitting device is embedded in a lighting apparatus and is configured to emit a white light produced by mixing the red light, the green light and the white light emitted from the white light emitting unit.

5. The light emitting device of claim 2, wherein the first light is a blue light and the second light is a yellow light.

6. The light emitting device of claim 2, wherein the light emitting device is embedded in a lighting apparatus and is configured to emit a white light produced by mixing the red light, the green light and the white light emitted from the white light emitting unit.

7. The light emitting device of claim 3, wherein the light emitting device is embedded in a lighting apparatus and is configured to emit a white light produced by mixing the red light, the green light and the white light emitted from the white light emitting unit.

8. The light emitting device of claim 5, wherein the light emitting device is embedded in a lighting apparatus and is configured to emit a white light produced by mixing the red light, the green light and the white light emitted from the white light emitting unit.

9. The light emitting device of claim 1, a chromaticity variation of each of the red light and the green light is smaller than that of the white light.

10. The light emitting device of claim 2, a chromaticity variation of each of the red light and the green light is smaller than that of the white light.

11. The light emitting device of claim 3, a chromaticity variation of each of red light and the green light is smaller than that of the white light.

12. The light emitting device of claim 4, a chromaticity variation of each of the red light and the green light is smaller than that of the white light.

13. The light emitting device of claim 1, the light emitting device consists of the white light emitting unit, the red light emitting unit and the green light emitting unit.

14. The light emitting device of claim 2, the light emitting device consists of the white light emitting unit, the red light emitting unit and the green light emitting unit.

15. The light emitting device of claim 3, the light emitting device consists of the white light emitting unit, the red light emitting unit and the green light emitting unit.

16. The light emitting device of claim 4, the light emitting device consists of the white light emitting unit, the red light emitting unit and the green light emitting unit.

17. The light emitting device of claim 9, the light emitting device consists of the white light emitting unit, the red light emitting unit and the green light emitting unit.

\* \* \* \* \*